(12) United States Patent
Vaez-Iravani et al.

(10) Patent No.: US 10,923,371 B2
(45) Date of Patent: Feb. 16, 2021

(54) METROLOGY SYSTEM FOR SUBSTRATE DEFORMATION MEASUREMENT

(71) Applicant: Applied Materials, Inc., Santa Clara, CA (US)

(72) Inventors: Mehdi Vaez-Iravani, Los Gatos, CA (US); Todd Egan, Fremont, CA (US); Samer Banna, San Jose, CA (US); Kyle Tantiwong, Livermore, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 99 days.

(21) Appl. No.: 16/079,961

(22) PCT Filed: Mar. 30, 2017

(86) PCT No.: PCT/US2017/025112
§ 371 (c)(1),
(2) Date: Aug. 24, 2018

(87) PCT Pub. No.: WO2017/173129
PCT Pub. Date: Oct. 5, 2017

(65) Prior Publication Data
US 2019/0074201 A1    Mar. 7, 2019

Related U.S. Application Data

(60) Provisional application No. 62/315,662, filed on Mar. 30, 2016.

(51) Int. Cl.
*G06K 9/00* (2006.01)
*H01L 21/67* (2006.01)
(Continued)

(52) U.S. Cl.
CPC ........ *H01L 21/67288* (2013.01); *G01B 11/24* (2013.01); *G01B 11/306* (2013.01);
(Continued)

(58) Field of Classification Search
None
See application file for complete search history.

(56) References Cited

U.S. PATENT DOCUMENTS 6,525,827 B2  2/2003  Liu
8,148,663 B2  4/2012  Adams et al.
(Continued)

FOREIGN PATENT DOCUMENTS

KR   1020080058031 A   6/2008
WO      2016016972 A1   2/2016

OTHER PUBLICATIONS

International Search Report and Written Opinion dated Jul. 13, 2017 for Application No. PCT/US2017/025112.
(Continued)

*Primary Examiner* — Suhail Khan
(74) *Attorney, Agent, or Firm* — Patterson + Sheridan LLP

(57) ABSTRACT

Embodiments of the disclosure provide methods and system for inspecting and treating a substrate. In one embodiment, a method is provided including transmitting a first plurality of beams from a diffractive beam splitter to a first surface of a substrate to generate a reflection of a second plurality of beams, wherein the first plurality of beams are spaced apart from each other upon arriving at the first surface of the substrate; receiving the second plurality of beams on a recording surface of an optical device, wherein the second plurality of beams are spaced apart from each other upon arriving at the recording surface; measuring positional information of the second plurality of beams on the recording surface; comparing the positional information of the second plurality of beams to positional information stored in a memory; and storing a result of the comparison in the memory.

14 Claims, 6 Drawing Sheets

(51) Int. Cl.
*G01B 11/24* (2006.01)
*G01B 11/30* (2006.01)
*H01L 21/66* (2006.01)
*G01N 21/956* (2006.01)
*G06T 7/00* (2017.01)

(52) U.S. Cl.
CPC ........... *G01N 21/956* (2013.01); *G06T 7/001* (2013.01); *H01L 22/12* (2013.01); *G01N 2021/95615* (2013.01); *G06T 2207/30148* (2013.01)

(56) References Cited

U.S. PATENT DOCUMENTS

| | | |
|---|---|---|
| 8,534,135 B2 | 9/2013 | Johnson et al. |
| 9,484,274 B2 | 11/2016 | Bencher et al. |
| 2005/0133739 A1* | 6/2005 | Ogasawara ......... H01J 37/3174 250/492.22 |
| 2007/0134821 A1 | 6/2007 | Thakur et al. |
| 2007/0146685 A1 | 6/2007 | Yoo et al. |
| 2013/0021610 A1 | 1/2013 | Zettler et al. |
| 2014/0333936 A1 | 11/2014 | Chang et al. |
| 2015/0325411 A1 | 11/2015 | Godet et al. |

OTHER PUBLICATIONS

KSA MOS, "Control Your Stress! In Situ Curvature and Thin Film Stress Monitoring", https://www.k-space.com/wp-content/uploads/MOS_Product_Specs.pdf.

* cited by examiner

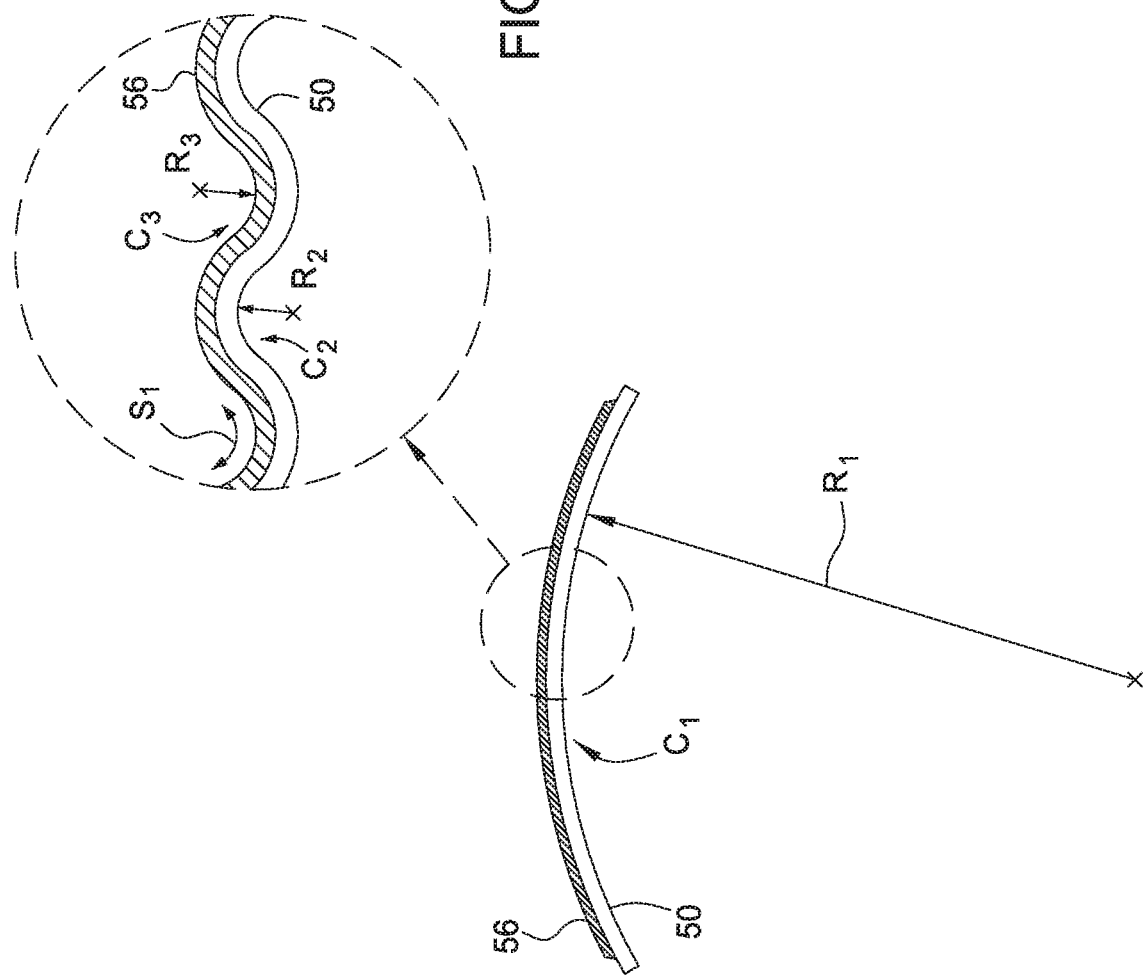

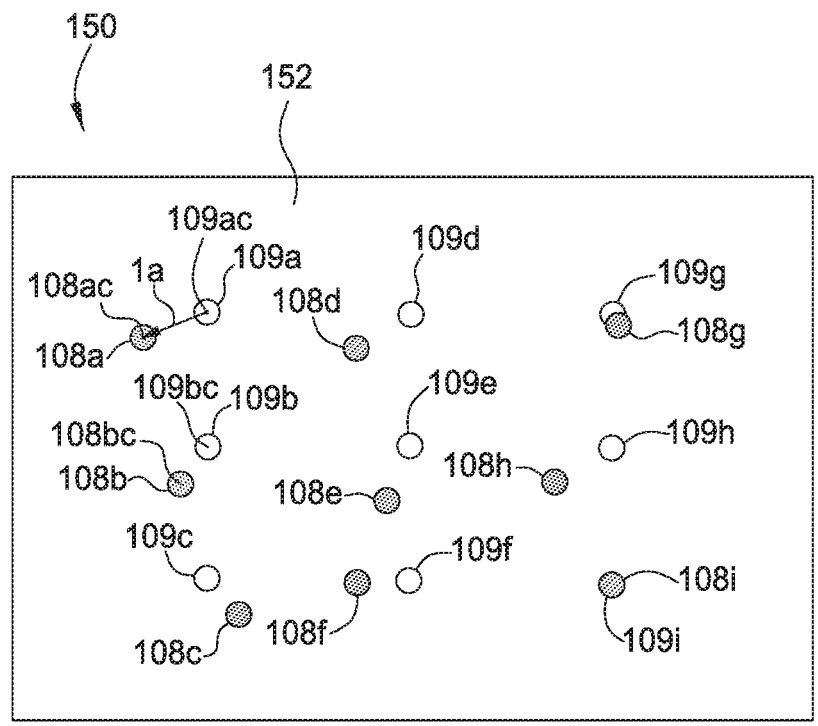
FIG. 3
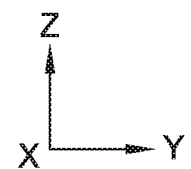

METROLOGY SYSTEM FOR SUBSTRATE DEFORMATION MEASUREMENT

BACKGROUND OF THE INVENTION

Field of the Invention

Embodiments of the disclosure generally relate to a metrology system and methods of using the same, and more specifically to methods and a system for measuring a deformed state of a substrate due to stress induced during processing.

Description of the Related Art

The deposition of a thin film on semiconductor substrates often leads to the generation of local stresses within the substrate. These stresses can lead to an overall warping of the substrate as well as to local defects across the substrate, such as on the front side and the back side of the substrate. For example, FIGS. 1A-1B depict an example of a film layer 56 formed on a substrate 50, which may both be locally and/or globally deformed. The local and/or global deformations of the substrate 50 and the film layer 56 may be caused by the stress resulting from the differences between the substrate 50 and the film layer 56, such as stresses caused by the atoms in the film layer 56 not aligning with the lattice structure of the substrate 50. The resulting stress effects the topography of the surface of the substrate 50 and the surface of the film layer 56.

For example, in FIG. 1A, the substrate 50 is deformed and curved, having a back surface with a curvature C1. The curvature C1 of the back surface of the substrate can be defined by a first radius R1. In addition to the global back surface curvature C1, areas of the film layer 56 and the substrate 50 may have local deformations including curvatures different from the back surface curvature C1. For example, FIG. 1B illustrates a close-up view of the local deformations of the substrate 50 and film layer 56. The local deformations of the substrate 50 and the film layer 56 can be due to the thermal expansion or plasma non-uniformities during a plasma process, or to other non-uniformities present during a process performed on the substrate 50. Such non-uniformities can cause localized deformations for the back surface of the substrate 50 and the front surface of the film layer 56. For example, the localized deformations on the substrate 50 can also be defined by curves, such as a local back surface curvature C2 with a second radius R2, which is different from the first radius R1 of the global back surface curvature C1. The localized curvature C2 may also cause or be adjacent to an uneven surface to the film layer 56 disposed on the substrate 50, leading to a localized curvature C3 that has a third radius R3 that may all be created by a stress S1 formed in the film layer 56. The global back surface curvature C1 formed on the back surface of the substrate 50 may be at least partially addressed by clamping or restraining the substrate to a substrate support using a substrate holding device, such as an electrostatic chuck.

However, in most of the situations, the process of clamping or restraining a substrate is not effective in reducing the localized curvatures C2-C3 formed in the substrate. Techniques for removing localized deformations (e.g., localized curvatures C2-C3) can be used, such as localized heating of the film layer 56 or localized ion bombardment of the film layer 56. The stress caused by the film layer 56 and the resulting localized deformation (e.g., the curvature C3) are generally not distributed in a uniform manner across the substrate. Therefore, a map of the deformations on the front or back surface of the substrate 50 can be used to enable targeted methods for alleviating the stress caused by deposited films in order to remove the localized deformations.

One approach to map the surfaces of substrates is multi-spot local slope metrology, which is the technique used by the KSA MOS produced by K-Space Associates, Inc. Multi-spot local slope metrology is generally performed by directing a laser beam, through an etalon. The etalon can output multiple beams from a single input beam by reflections of the single input beam in the etalon. The reflections from the etalon can be used to create an array of output beams. The array of output beams can be directed to different spots on the surface of the substrate to be measured.

Despite the capability of being able to direct multiple beams onto a surface of the substrate, multi-spot local slope metrology techniques using etalons suffer from a number of drawbacks. First, the intensity of the output beams from the etalon can vary for each beam due to changes in intensity caused by the reflections that occur within the etalon. These intensity variations can complicate and the reduce the accuracy of the measurements obtained if the intensity variations are not known with enough precision to account for the intensity variations in the calculations for determining the local slope of the substrate. Second, creating a 2-dimensional array of output beams can complicate the optical design of the multi-spot local slope metrology tool that uses etalons. For example, multiple etalons are often required to create the 2-dimensional array, and the problems caused by intensity variations of the output beams can be exacerbated when using multiple etalons. Third, because the output beams are created from reflections of an input beam, the output beams are necessarily related to each other. For example, the spacing between the output beams from the etalon are generally follow a distinct pattern, such as all being the same. The symmetry of the output beams from etalon can limit the use of multi-spot local slope metrology techniques using etalons to measuring substrates with deformations that are symmetrically spaced across the surface of the substrate.

Therefore, there exists a need for improved methods and systems to perform multi-spot local slope metrology to map surfaces of substrates, so that device performance, product reliability, and yield can be improved in a more efficient manner.

SUMMARY

Embodiments of the disclosure generally relate to a metrology system and methods of using the same, and more specifically to methods and a system for measuring a deformed state of a substrate due to stress induced during processing. In one embodiment, a method of inspecting a substrate is provided. The method includes transmitting a first plurality of beams from a diffractive beam splitter to a first surface of a substrate to generate a reflection of a second plurality of beams, wherein the first plurality of beams are spaced apart from each other upon arriving at the first surface of the substrate, receiving the second plurality of beams on a recording surface of an optical device, wherein the second plurality of beams are spaced apart from each other upon arriving at the recording surface, measuring positional information of the second plurality of beams on the recording surface; comparing the positional information of the second plurality of beams to positional information stored in a memory and storing a result of the comparison in the memory.

In another embodiment, a method of treating a substrate is provided. The method includes transmitting a first plurality of beams from a diffractive beam splitter to a first surface of a substrate to generate a reflection of a second plurality of beams, wherein the first plurality of beams are spaced apart from each other upon arriving at the first surface of the substrate; receiving the second plurality of beams on a recording surface of an optical device, wherein the second plurality of beams are spaced apart from each other upon arriving at the recording surface; measuring positional information of the second plurality of beams on the recording surface; comparing the positional information of the second plurality of beams to positional information stored in a memory; and treating the substrate based on the comparison.

In another embodiment, a metrology system is provided. The metrology system includes a substrate support configured to receive a substrate thereon; an energy source configured to emit a first energy beam; a diffractive beam splitter positioned to receive the first energy beam, the diffractive beam splitter configured to generate a first plurality of beams from the first energy beam; a beam splitter positioned to receive the first plurality of beams and output a second plurality of beams; a lens positioned between the beam splitter and the substrate support, the lens adapted to focus the second plurality of beams on a first surface of the substrate positioned on the substrate support; an optical device having a recording surface adapted to receive a third plurality of beams generated from a reflection of the first plurality of beams on the first surface; and a controller configured to measure positional information of the third plurality of beams on the recording surface and compare the positional information of the third plurality of beams on the recording surface with positional information stored in memory.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings.

FIGS. 1A-1B depict a cross sectional view of a substrate having a global curvature and localized deformations.

FIG. 3 is a top view of a recording surface of an optical device, according to one embodiment.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the disclosure describe a metrology system for measuring the amount of deformation found within a substrate. The metrology system may be adapted to detect the variation in the slope across various regions of the surface of the substrate. In one embodiment, surface topography variations of a substrate can be measured by comparing reflections of a matrix of beams from a reference object having a flat surface relative to reflections of corresponding beams from a surface of the substrate.

Figure 2A:
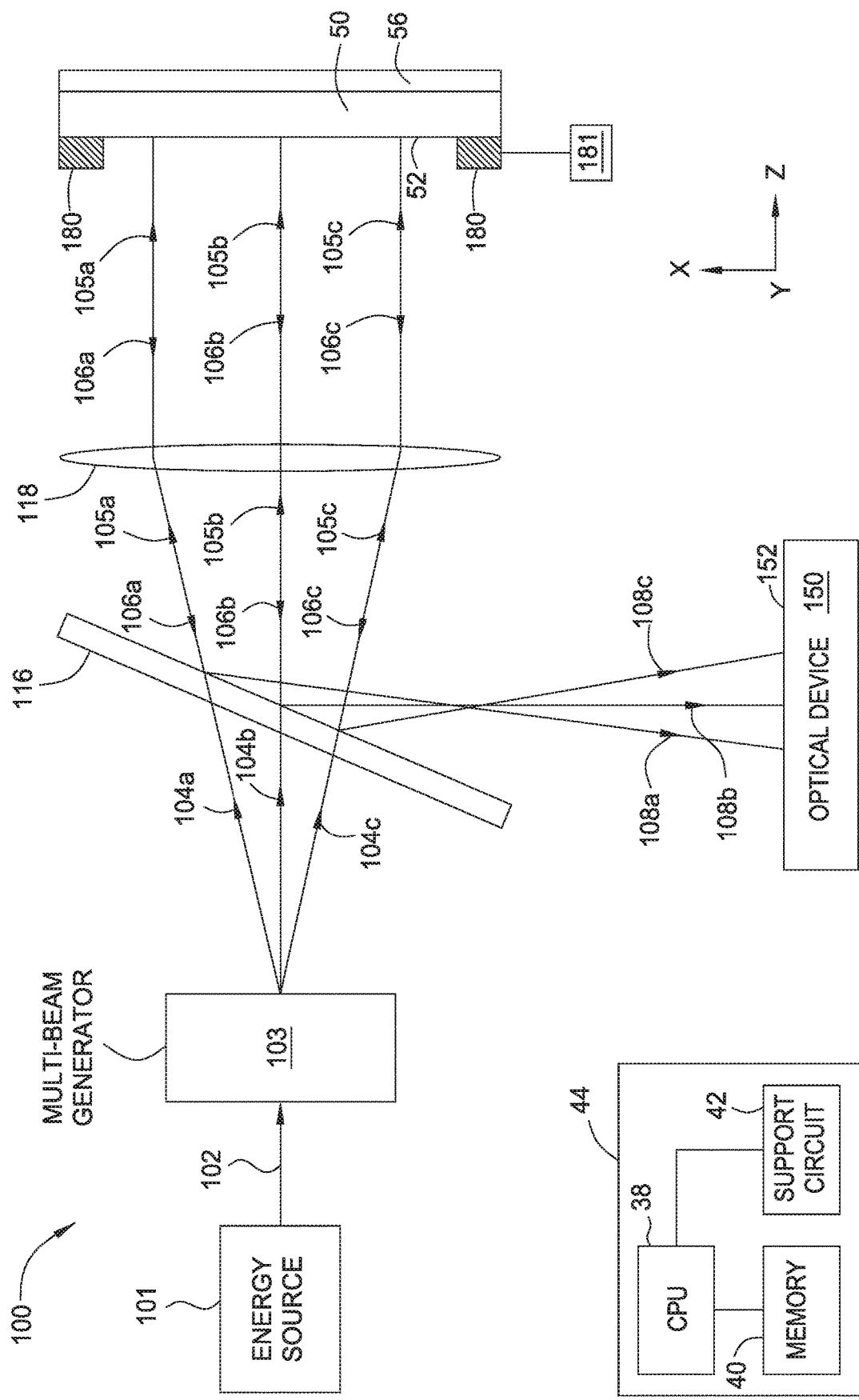
FIG. 2A illustrates a schematic view of a metrology system and a substrate, according to one embodiment.

FIG. 2A illustrates a schematic view of a metrology system 100 and a substrate 50, according to one embodiment. The film layer 56 described above can be formed on the substrate 50 and the substrate 50 and film layer 56 can include the curvatures described above (e.g., localized curvatures C2-C3). The metrology system 100 can be used to measure localized deformations on the substrate 50. For example, the metrology system 100 can measure the slope of a back surface 52 (first surface) of the substrate 50 facing the metrology system 100. However, in some embodiments a front surface of the substrate 50 or the film layer 56 can be measured. The metrology system 100 can include a substrate support 180 for supporting the substrate 50 during the inspection process performed by the metrology system 100. In the view shown in FIG. 2A, the Z-direction can be the upward vertical direction, so that the back surface 52 of the substrate 50 is resting on the substrate support 180. In some embodiments, the substrate support 180 can be an edge ring. Furthermore, in some embodiments the substrate support can be movable in the X-Y plane, for example by use of an actuator 181 coupled to the substrate support 180.

The metrology system 100 includes an energy source 101 configured to emit a first energy beam 102. The energy source 101 can be, for example, a collimated, coherent light source (i.e., coherent electromagnetic radiation), such as a laser. In some embodiments, the laser can be a red laser or a green laser having a power from about 20 mW to about 100 mW, such as about 50 mW.

The metrology system 100 can further include a diffractive beam splitter 103 (also known as a diffractive optical element or a multi-spot beam generator) positioned to receive the first energy beam 102. The diffractive optical element 103 can be configured to output a first plurality of beams 104 (individually shown as 104a, 104b, 104c) from the first energy beam 102. The diffractive beam splitter 103 can receive a single input beam from the energy beam 102 and output a 1-dimensional array (1×N) or a 2-dimensional beam matrix (M×N) of the first plurality of beams 104, so that the first plurality of beams 104 can be delivered to different locations of a surface of the substrate 50 or other target. FIG. 2A shows three beams 104a, 104b, 104c angularly spaced apart in the X-direction, but the diffractive optical element may also output additional beams angularly spaced apart from the beams 104a, 104b, 104c in the Y-direction as well as additional beams angularly spaced apart from the beams 104a, 104b, 104c in the X-direction. In one example, the diffractive beam splitter is adapted to generate an array of beams, from the provided energy beam 102, where the beams are angularly spaced apart from each other in a first direction and also angularly spaced apart from each other in a second direction.

The array of beams output from the diffractive beam splitter 103 is improved in a number of ways relative to an array of beams output from an etalon as described above. First, because the diffractive beam splitter creates output beams from diffraction instead of the transmissions and reflections described above for the etalon, the output beams from the diffractive beam splitter 103 do not suffer from the same intensity variations as the output beams from an etalon. Because there are less intensity variations in the output beams produced by the diffractive beam splitter 103, the calculations of the local slope on different locations of the substrate can be simplified. Furthermore, a 2-dimensional array can be created one diffractive beam splitter 103, which offers a simpler design relative to the creating a 2-dimensional array with a design using multiple etalons. Finally, use of a diffractive beam splitter enables designs that can customize the output beams to the deformations expected on the surface of the substrate. For example, the diffractive beam splitter can be designed to transmit beams that are more closely packed towards the center of the 2-dimensional array of output beams than near the edges of the 2-dimensional array of output beams. Thus, specific areas of the surface of the substrate, which are expected to have greater deformations or a greater concentration of deformations can be preferentially targeted by designing the diffractive beam splitter to direct a greater concentration of beams towards those portions of the surface of the substrate.

The metrology system 100 can further include a beam splitter 116 positioned to receive the first plurality of beams 104 and output a second plurality of beams 105 (shown individually as 105a, 105b, 105c) from transmission of the first plurality of beams 104 through the beam splitter 116. The beam splitter 116 is also used to direct reflected beams from the substrate 50 to an optical device 150 (e.g., a camera) as described in further detail below.

The metrology system 100 can further include a lens 118 positioned between the beam splitter 116 and the substrate support 180. The lens 118 can be adapted to focus the second plurality of beams 105 on the back surface 52 of the substrate 50 positioned on the substrate support 180. The second plurality of beams 105 are spaced apart from each other upon arriving at the back surface 52 of the substrate 50. The lens 118 can be positioned so as to enable the back surface 52 of the substrate 50 to be inspected. For example, in one embodiment, the lens 118 can be positioned below the substrate support 180. Furthermore, inspecting the back surface 52 of the substrate 50 while the back surface 52 is resting on the substrate support 180 can also allow for the substrate 50 to be treated while on the substrate support 180. For example, the substrate 50 can be inspected using the methods described below and then the film layer 56 on the top surface of the substrate 50 can be treated (e.g., localized heating or localized ion bombardment of the film layer 56) without moving the substrate 50 from the substrate support 180.

The focusing of the second plurality of beams 105 on the back surface 52 of the substrate 50 generates a reflection of a third plurality of beams 106 (shown individually as 106a, 106b, 106c). The third plurality of beams 106 pass through the lens 118 to the beam splitter 116. The beam splitter 116 reflects at least a portion of the third plurality of beams 106 as a fourth plurality of beams 108 (shown individually as 108a, 108b, 108c). The fourth plurality of beams 108 are reflected to the optical device 150.

The metrology system 100 further includes the optical device 150 having a recording surface 152 adapted to receive the fourth plurality of beams 108 generated from the reflection of the second plurality of beams 105 on the back surface 52 of the substrate. The optical device 150 can be a camera, such as a charge-coupled device (CCD) camera, or other electromagnetic energy detection device that is able to detect the relative position of the plurality of beams to each other when the plurality of beams are provided to the optical device. The fourth plurality of beams 108 are spaced apart from each other upon arriving at the recording surface 152.

In some embodiments, the beam fan-out (108a-108c) can be so spread out as to be larger than the size of the recording surface 152 of the optical device 150 (e.g., the CCD detector of the camera). For example, the finite size of the fanned-out beams may make it difficult to accommodate more than just a few beams directly on the recording surface 152 of the optical device 150. In such case, the beams 108a-108c can be allowed to impinge on a separate screen, such as a plane, semi-smooth scattering, or a translucent screen. This separate screen can be arbitrarily large to allow for the recording of as many beams as used in a given application. The optical device 150 can then used to image the spots that are formed on the separate screen. Using a fixed distance between the camera and the separate screen, together with a well-focused image of the spots on the separate screen can allow for the precise measurement of the position of the spots.

The metrology system 100 can further include a controller 44. The controller 44 in communication with the optical device 150 can measure positional information of the fourth plurality of beams 108 incident upon the recording surface 152 of the optical device 150. For example, the positional information measured by the controller 44 can include the locations of each of the fourth plurality of beams 108 on the recording surface 152 of the optical device 150. In one embodiment, the positional information can include positions of centroids of each of the fourth plurality of beams 108 on the recording surface 152 of the optical device 150.

The controller 44 generally includes a central processing unit (CPU) 38, a memory 40, and support circuits 42. The CPU 38 may be one of any form of a general purpose computer processor that can be used in an industrial setting. The support circuits 42 are conventionally coupled to the CPU 38 and may comprise cache, clock circuits, input/output subsystems, power supplies, and the like. Software routines loaded in the memory 40 transform the CPU 38 into a specific purpose computer (controller) 44. The memory 40 can include non-transitory memory that can host an application, which, when executed by the CPU 38, can instruct the components of the metrology system 100 to perform the methods described herein, such as the method 400 described below in reference to FIG. 4.

The controller 44 can be used to operate the metrology system 100, for example by energizing the energy source 101, controlling and communicating with the optical device 150. In some embodiments, the controller 44 may also control movement of the substrate support 180 through use of the actuator 181 as well as control the transfer of the substrate 50 and the reference object 60 (FIG. 2B) onto the substrate support 180 and removal of the substrate 50 and the reference object 60 from the substrate support 180.

The controller 44 can compare the positional information of the fourth plurality of beams 108 on the recording surface 152 with positional information stored in the memory 40. This positional information stored in the memory 40 used for the comparison can be actual locations of beams on the recording surface 152 (see FIG. 2B description) or predicted locations on the recording surface 152 that the fourth plurality of beams 108 would arrive at if the back surface 52 of the substrate 50 is entirely flat. The controller 44 can store one or more results of this comparison in the memory 40. The comparison between the positional information of the fourth plurality of beams 108 on the recording surface 152 and the positional information stored in memory 40 is described in further detail below in reference to FIG. 3.

Figure 2B:
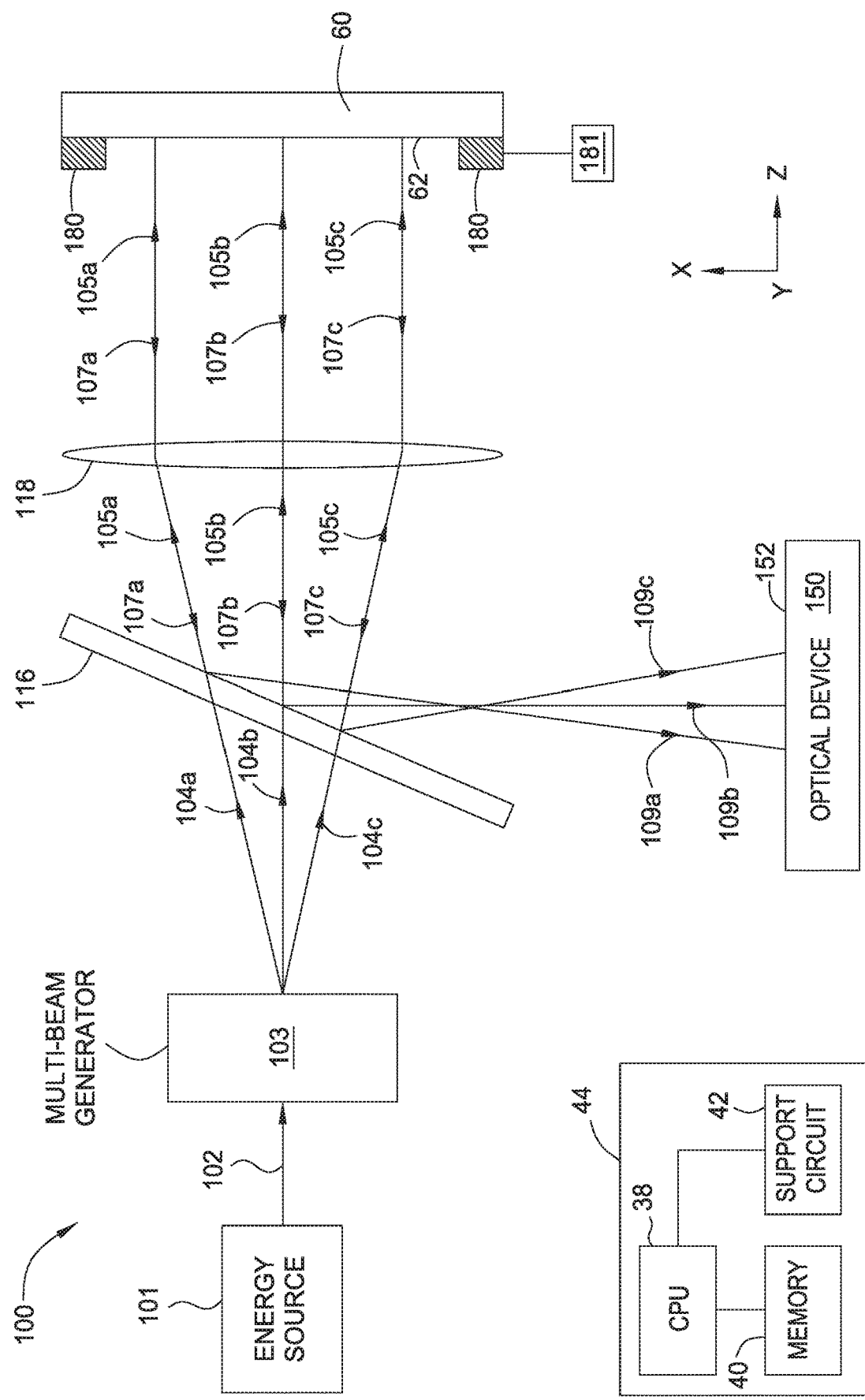
FIG. 2B illustrates a schematic view of a metrology system and a reference object, according to one embodiment.

FIG. 2B illustrates a schematic view of the metrology system 100 and a reference object 60, according to one embodiment. The components shown in FIG. 2B are the same as FIG. 2A except that the reference object 60 is placed on the substrate support 180 instead of the substrate 50. In one embodiment, the reference object is an optical flat. The reference object 60 can have a reference surface 62. The reference surface 62 can be a flat surface or a surface having one or more other specified features, such as a surface with a specific slope at a given location on the surface, or a surface with a specific pattern (e.g., a pattern created by a lithography process) that can be inspected by the metrology system 100 or a similar metrology system. Although the reference surface 62 can be other than a flat surface, for the remainder of this application the reference surface is referred to as having a flat surface unless otherwise specified. In one embodiment, the reference object 60 is a semiconductor substrate and the reference surface 62 is a flat, polished surface of the semiconductor substrate. The reference object 60 can be positioned on the substrate support 180 and the energy source 101 can be energized as described above in reference to FIG. 2A, so that the beams are emitted by the energy source 101 and directed to the reference surface 62 by the metrology system 100, and beams reflecting from the reference surface 62 are directed by the beam splitter 116 to the recording surface 152 of the optical device 150.

Because the substrate 50 is replaced with the reference object 60, the path of the reflected beams is different in FIG. 2B than reflected beams of FIG. 2A. For example, the third plurality of beams 106 reflected from the substrate 50 are replaced with a fifth plurality of beams 107 (shown individually as 107a, 107b, 107c) reflected from the reference object 60. Similarly, the fourth plurality of beams 108 reflected from the beam splitter 116 to the optical device 150 are replaced with a sixth plurality of beams 109 (shown individually as 109a, 109b, 109c). Because the reference surface 62 is flat and the back surface 52 of the substrate 50 is not flat, the plurality of beams 109 are incident upon different locations of the recording surface 152 of the optical device 150 than the fourth plurality of beams 108 described above.

The controller 44 in communication with the optical device 150 can measure positional information of the sixth plurality of beams 109 incident upon the recording surface 152 of the optical device 150. For example, the positional information measured by the controller 44 can include the locations of each of the sixth plurality of beams 109 on the recording surface 152 of the optical device 150. In one embodiment, the positional information can include positions of centroids of each of the sixth plurality of beams 109 on the recording surface 152 of the optical device 150. The controller 44 can compare the positions of the centroids of each of the fourth plurality of beams 108 (FIG. 2A) with the positions of the corresponding centroids of each of the sixth plurality of beams 109.

FIG. 3 is a top view of the recording surface 152 illustrating exemplary locations where the optical device 150 can sense the fourth plurality of beams 108 (FIG. 2A) and the sixth plurality of beams 109 (FIG. 2B). FIG. 3 shows positions of where nine of the fourth plurality of beams 108 (shown individually as 108a-108i) are incident upon the recording surface 152 and positions of where nine of the sixth plurality of beams 109 (shown individually as 109a-109i) are incident upon the recording surface 152. Each beam in the fourth plurality of beams 108 has a corresponding beam in the sixth plurality of beams 109. For example, the beam 108a corresponds to the beam 109a because each beam 108a, 109a results from a reflection from the beam 105a, which arrives at corresponding locations on the substrate 50 (FIG. 2A) and the reference object 60 (FIG. 2B) respectively.

Because the reference surface 62 is flat, the locations of the sixth plurality of beams 109 on the recording surface 152 can serve as reference locations for where the corresponding beams in the fourth plurality of beams 108 should be incident upon the recording surface 152 if the back surface 52 of the substrate 50 is flat. For example, the beam 108i and the beam 109i are shown at the same location on the recording surface 152, which indicates that the back surface 52 of the substrate 50 is flat at the location where the beam 105i (not shown) was incident upon the back surface 52 of the substrate 50.

For locations on the back surface 52 of the substrate 50 that are not flat, then the corresponding beams 108, 109 will not coincide at the same location on the recording surface 152. For example, the location of a centroid 108ac of the beam 108a on the recording surface 152 is spaced apart from a location of a centroid 109ac of the beam 109a on the recording surface 152 indicating that the back surface 52 of the substrate 50 is not flat at the location where the beam 105a (FIG. 2A) was incident upon the back surface 52 of the substrate 50. A greater distance between centroids of corresponding beams (e.g., centroids 108ac, 109ac) indicates a greater slope of the back surface 52 of the substrate 50 at the location on the back surface 52 of the substrate 50, which generated the reflection resulting in the corresponding beam in the fourth plurality of beams 108. For example, the centroid 108ac of the beam 108a is spaced further apart from the centroid 109ac of the beam 109a on the recording surface 152 than a centroid 108bc of the beam 108b is from a centroid 109bc of the beam 109b on the recording surface 152. Therefore, the back surface 52 of the substrate 50 has a greater slope at the location upon which the beam 105a is incident upon the back surface 52 than the location upon which the beam 105b is incident upon the back surface 52.

The direction that the centroids of the corresponding beams (e.g., beams 108a, 109a) are spaced apart on the recording surface 152 can also be measured by the controller 44 in communication with the optical device 150, and the measurement can be used to determine which direction the back surface 52 is sloping at the location on the back surface 52 of the substrate 50, where the corresponding beam in the second plurality of beams (e.g., beam 105a) was incident upon the back surface 52. Thus, a vector indicating distance and direction between centroids of each pair of corresponding beams (e.g., beams 108a, 109a) on the recording surface 152 can be used to calculate the slope at each location on the back surface 52 of the substrate 50 upon which the second plurality of beams 105 (FIG. 2A) are incident upon the back surface 52 of the substrate 50. For example, a vector 1a is shown between centroids 108ac, 109ac of corresponding beams 109a and 108a. The controller 44 can use the slopes at each of the locations on the back surface 52 of the substrate 50 to form a map of the back surface 52 of the substrate 50. Furthermore, because the slope of the back surface 52 is often directly related to the slope on the other side of the substrate 50, such as the top of the film layer 56 shown in FIG. 1B, the slope of the front surface of the substrate and/or the slope of the film layer 56 can be determined from the slope of the back surface 52 enabling a map of the front surface of the substrate 50 and/or film layer 56 to be determined. The map of the film layer 56 can then be used for targeted treatment of the film layer 56 to reduce the stress caused by the film layer 56. For example, localized heating of the film layer 56 or localized ion bombardment of the film layer 56 can be performed to reduce or eliminate deformations on the substrate 50 and film layer, such as the curvatures C2-C3 described above in reference to FIG. 1B.

Referring to FIG. 2A, in some embodiments, to create a more detailed map of the back surface 52 of the substrate 50, the metrology system 100 can be configured to enable the second plurality of beams 105 to be incident upon different locations of the back surface 52 of the substrate 50 for different energy beams emitted by the energy source 101. For example, in one embodiment the substrate support 180 is movable in the X-Y plane (e.g., by use of the actuator 181) enabling the second plurality of beams 105 for different beams to be incident upon different locations of the back surface 52 of the substrate 50 after each movement of the substrate support 180 in the X-Y plane. The metrology system 100 can perform a corresponding sequence of movements of the substrate support 180 in the X-Y plane with the reference object 60 (FIG. 2B) on the substrate support 180 to determine reference points on the recording surface 152 that indicate the second plurality of beams 105 being incident upon a flat surface for each movement of the substrate support 180. Thus, the movement of the substrate support 180 can enable a more detailed map to be created of the back surface 52 of the substrate 50.

Figure 4:
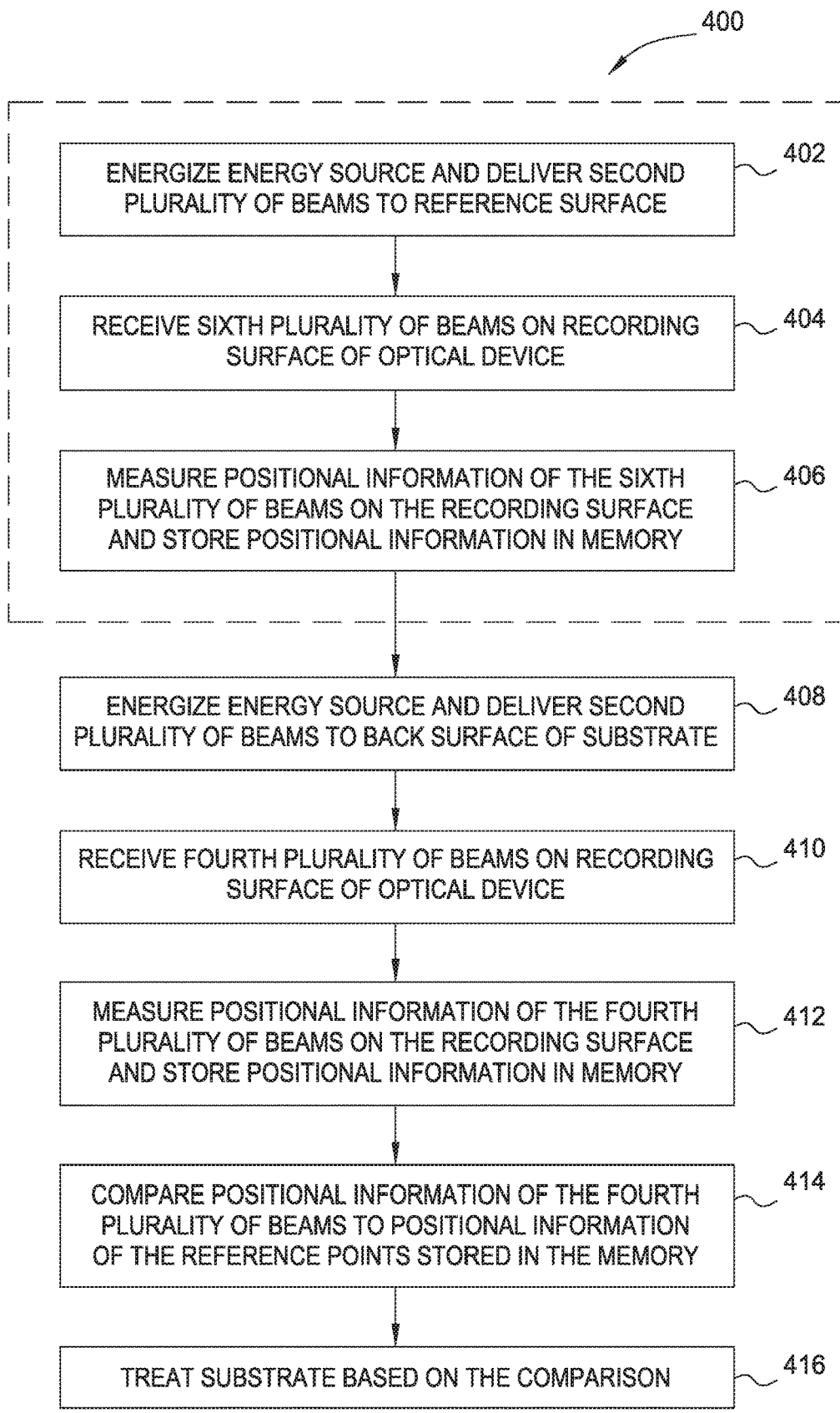
FIG. 4 is a process flow diagram of a method 400 for inspecting and treating the substrate 50, according to one embodiment.

FIG. 4 is a process flow diagram of a method 400 for inspecting and treating the substrate 50, according to one embodiment. Referring also to FIG. 2B, at block 402, the energy source 101 is energized and the second plurality of beams 105 are delivered to reference surface 62 of the reference object 60, wherein the second plurality of beams 105 are spaced apart from each other upon arriving at the reference surface 62 of the reference object 60. The second plurality of beams 105 are generated from the transmission of the first plurality of beams 104 from the diffractive beam splitter 103. The second plurality of beams 105 incident upon the reference surface 62 of the reference object 60 results in the reflection that generates the sixth plurality of beams 109 that are directed from the beam splitter 116 to the optical device 150. At block 404, the sixth plurality of beams 109 are received on the recording surface 152 of the optical device 150, wherein the sixth plurality of beams 109 are spaced apart from each other upon arriving at the recording surface 152. At block 406, positional information of the sixth plurality of beams 109 on the recording surface 152 is measured by the controller 44 and stored in the memory 40. As described above, the positional information of the sixth plurality of beams 109 on the recording surface 152 generated from reflections from the flat reference surface 62 are used as reference points for identifying where corresponding reflections from flat portions of the back surface 52 of the substrate will be incident upon the recording surface 152.

Blocks 402-406 can often be optional, and there is no requirement to execute these blocks each time a substrate 50 is inspected. For example, in some embodiments, blocks 402-406 may be executed once and then numerous substrates 50 may inspected, such as 100 or more substrates. Furthermore, in some embodiments there may be no requirement to execute the blocks 402-406 on a given metrology system 100 as the locations for where the fourth plurality of beams 108 (FIG. 2A) will be incident upon the recording surface 152 when generated from reflections from a flat surface (e.g., reference surface 62) may already be known from calculations or from executing blocks 402-406 on an identical metrology system.

Referring also to FIG. 2A, at block 408, the energy source 101 is energized and the second plurality of beams 105 are delivered to the back surface 52 of the substrate 50, wherein the second plurality of beams 105 are spaced apart from each other upon arriving at the back surface 52 of the substrate 50. The second plurality of beams 105 are generated from the transmission of the first plurality of beams 104 from the diffractive beam splitter 103. The second plurality of beams 105 incident upon the back surface 52 of the substrate 50 results in the reflection that generates the fourth plurality of beams 108 that are directed from the beam splitter 116 to the optical device 150. At block 410, the fourth plurality of beams 108 are received on the recording surface 152 of the optical device 150, wherein the fourth plurality of beams 108 are spaced apart from each other upon arriving at the recording surface 152. At block 412, positional information of the fourth plurality of beams 108 on the recording surface 152 are measured by the controller 44 and stored in the memory 40. In some embodiments, the processes performed in blocks 408-410 are repeated multiple times across different regions of the substrate surface, as similarly performed during blocks 402-406, as discussed above. The position of the different regions and relative positions of the beams within the different regions can be determined and stored in memory along with the related positional information collected in block 412 by use of the optical device 150, sensors within the substrate support 180 and the controller 44.

At block 414, the positional information of the fourth plurality of beams 108 are compared to positional information of the reference points, at the same or similar X-Y positional location on the surface of the substrate, that are stored in the memory 40 (i.e., the reference points that indicate a flat surface). As described above, this comparison can be used to determine the slope of the back surface 52 of the substrate 50 for the locations on the back surface 52 of the substrate 50, where the second plurality of beams 105 were incident upon the back surface 52. For example, this comparison can determine vectors from the reference points to the location of the fourth plurality of beams 108 on the recording surface 152, such as the vector 1*a* described above in reference to FIG. 3. The results of the comparison (e.g., the slope of the back surface 52 of the substrate 50 at different locations on the back surface 52 or a map of the back surface 52 developed from the calculated slopes) can be stored in the memory 40.

At block 416, the substrate 50 can be treated based on the comparison performed in block 414. For example, the substrate 50 can be treated by performing localized heating of the film layer 56 deposited on the substrate 50 or localized ion bombardment of the film layer 56 deposited on the substrate 50.

In one embodiment, the reference surface 62 can be a surface of the substrate (e.g., rear surface) before a processing step (e.g., a deposition) is performed on the front surface of the substrate. For example, blocks 402-406 can be performed on the rear surface of a substrate before a processing step, such as a deposition step. Next, after block 406, the processing step is performed on the substrate. Then, blocks 408 to 412 are performed. Then, a comparison between the measurements made in block 406 and the measurements made in block 412 is made in block 414. Then a treatment (e.g., localized heating) in step 416 is performed in an attempt to restore the rear surface of the substrate to a condition, which will generate measurements similar to the measurements that were recorded in block 406. Blocks 408 to 416 can then be repeated in an iterative fashion as needed to treat the substrate in a way that restores the rear surface of the substrate to a condition, which causes the measurements recorded in block 412 to match or approach matching the measurements that were recorded in block 406 before the processing step (e.g., deposition) was performed on the substrate. Furthermore, after performing an iterative process on one substrate, knowledge of the overall treatment applied to that substrate in the multiple executions of block 416 can be used to apply that overall treatment in less executions of block 416, such as one execution of block 416, when similar measurements are recorded after an execution of block 412, such as a first execution of block 412. For example, although an iterative process of five executions of block 416 may be used to restore a rear surface of a first substrate to a pre-processing condition, a subsequent processed substrate may only be treated once to restore the rear surface of the subsequent substrate to the pre-processing condition.

Figure 5:
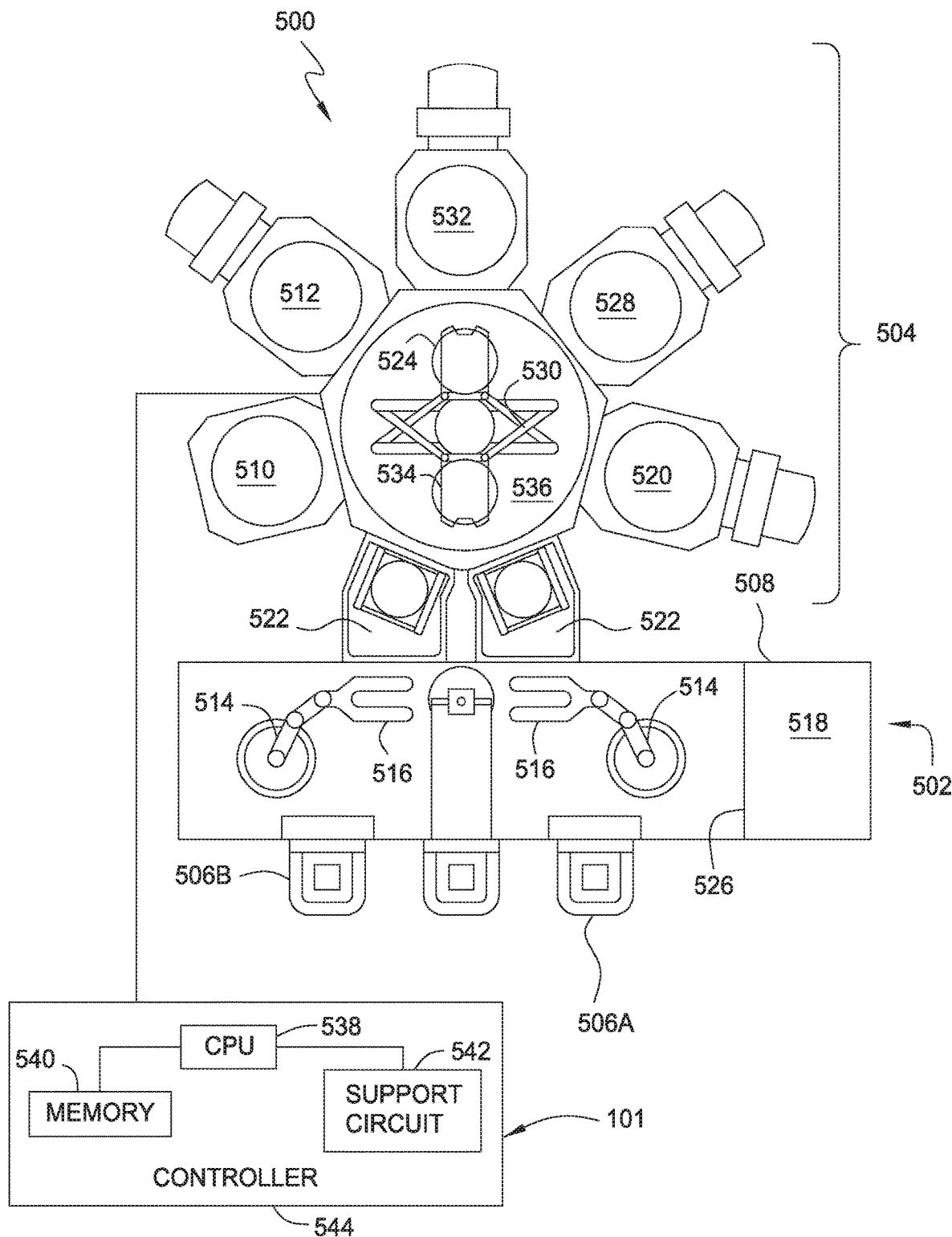
FIG. 5 is a schematic, top plan view of an exemplary processing system that includes the metrology system of FIG. 2A, according to one embodiment.

FIG. 5 is a schematic, top plan view of an exemplary processing system 500 that includes the metrology system 100 described above, according to one embodiment. In one embodiment, the processing system 500 may be a Centura® integrated processing system, commercially available from Applied Materials, Inc., located in Santa Clara, Calif. It is contemplated that other processing systems (including those from other manufacturers) may be adapted to benefit from the disclosure.

The system 500 includes a vacuum-tight processing platform 504, a factory interface 502, and a system controller 544. The platform 504 includes at least one metrology system 510, such as the metrology system 100 described above, a plurality of processing chambers 512, 532, 528, 520 and at least one load lock chambers 522 that is coupled to a vacuum substrate transfer chamber 536. Two load lock chambers 522 are shown in FIG. 5. The factory interface 502 is coupled to the transfer chamber 536 by the load lock chambers 522.

In one embodiment, the factory interface 502 comprises at least one docking station 508 and at least one factory interface robot 514 to facilitate transfer of substrates. The docking station 508 is configured to accept one or more front opening unified pod (FOUP). Two FOUPS 506A-B are shown in the embodiment of FIG. 5. The factory interface robot 514 having a blade 516 disposed on one end of the robot 514 is configured to transfer the substrate from the factory interface 502 to the processing platform 504 for processing through the load lock chambers 522. Optionally, one or more metrology stations 518 may be connected to a terminal 526 of the factory interface 502 to facilitate measurement of the substrate from the FOUPS 506A-B.

Each of the load lock chambers 522 has a first port coupled to the factory interface 502 and a second port coupled to the transfer chamber 536. The load lock chambers 522 are coupled to a pressure control system (not shown) which pumps down and vents the load lock chambers 522 to facilitate passing the substrate between the vacuum environment of the transfer chamber 536 and the substantially ambient (e.g., atmospheric) environment of the factory interface 502.

The transfer chamber 536 has a vacuum robot 530 disposed therein. The vacuum robot 530 has a blade 534 capable of transferring substrates 524 among the load lock chambers 522, the metrology system 510 and the processing chambers 512, 532, 528, 520.

In one embodiment of the system 500, the system 500 may include one or more metrology systems 510 (e.g., one or more of the metrology systems 100 described above) and at least one process chamber 512, 532, 528, 520, which may be a deposition chamber, etch chamber, thermal processing chamber (e.g., RTP chamber, laser anneal chamber) or other similar type of semiconductor processing chamber that may induce stress in a substrate during normal processing. In some embodiments of the system 500, one or more of metrology systems 510 may be disposed within one or more of the processing chambers 512, 532, 528, 520, the transfer chamber 536, the factory interface 502 and/or at least one of the load lock chambers 522.

The system controller 544 is coupled to the processing system 500. The system controller 544, which may include the controller 44 (FIG. 2A) or be included within the controller 44, can directly control the operation of the process chambers 512, 532, 528, 520 and the metrology system 510 of the system 500. Alternatively, the system controller 544 may control the computers (or controllers) associated with the process chambers 512, 532, 528, 520 and the metrology system 510 (e.g., controller 44) and the system 500. In operation, the system controller 544 also enables data collection and feedback from the respective chambers and metrology system 510 to optimize performance of the system 500.

The system controller 544, much like the controller 44 described above, generally includes a central processing unit (CPU) 538, a memory 540, and support circuit 542. The CPU 538 may be one of any form of a general purpose computer processor that can be used in an industrial setting. The support circuits 542 are conventionally coupled to the CPU 538 and may comprise cache, clock circuits, input/output subsystems, power supplies, and the like. The software routines transform the CPU 538 into a specific purpose computer (controller) 544. The software routines may also be stored and/or executed by a second controller (not shown) that is located remotely from the system 500.

Thus, embodiments of the disclosure provide a metrology system that may be utilized to measure film stress, slope of the substrate surface and surface topography variations on the substrate surface, such as after a film layer is formed on the substrate. The metrology system disclosed herein are relatively compact relative to conventional metrology devices, due in at least part to the utilization of relatively simple optical elements. Embodiments including the movable substrate support can create detailed maps of the surface of the substrate without including complicated optics. The compact size of the metrology systems may ease installation of the metrology system into a manufacturing tool (e.g., an existing manufacturing tool), such as a processing system, so as to save manufacturing cost and transportation time. Thus, a low cost and easily implemented metrology system is obtained to facilitate measurement of film stress, slope of surface of the substrate and surface topography variations on a substrate surface without adversely increasing manufacturing cycle time and cost.

While the foregoing is directed to embodiments of the present invention, other and further embodiments of the invention may be devised without departing from the basic scope thereof, and the scope thereof is determined by the claims that follow.

What is claimed is:

1. A method of inspecting a substrate comprising:
transmitting a first plurality of beams from a diffractive beam splitter to a first surface of a substrate to generate a reflection of a second plurality of beams, wherein the first plurality of beams are spaced apart from each other upon arriving at the first surface of the substrate;
receiving the second plurality of beams on a recording surface of an optical device, wherein the second plurality of beams are spaced apart from each other upon arriving at the recording surface;
determining a position on the recording surface for each beam of the second plurality of beams;
for each position of each beam of the second plurality of beams on the recording surface, comparing that individual position to an individual position on the recording surface of a corresponding beam from a third plurality of beams stored in a memory, wherein the third plurality of beams are generated by a reflection of a fourth plurality of beams incident upon a surface of an object other than the substrate;
determining a difference between the compared individual positions; and
storing a result of the comparison in the memory.

2. The method of claim 1, wherein the position of each beam of the second plurality of beams on the recording surface and the position of each beam of the third plurality of beams on the recording surface each comprise a position of a centroid of the corresponding beam on the recording surface.

3. The method of claim 2, wherein
comparing the individual position of each beam of the second plurality of beams to the individual position of the corresponding beam of the third plurality of beams comprises determining a vector from the centroid of each beam of the third plurality of beams on the recording surface to the centroid of each corresponding beam of the second plurality of beams on the recording surface.

4. The method of claim 3, further comprising calculating a local slope of the first surface of the substrate for each location on the first surface on which the first plurality of beams are received based on the determined vectors.

5. The method of claim 1, wherein a film is deposited on a second surface of the substrate and the first surface opposes the second surface.

6. The method of claim 1, wherein the optical device is a charge-coupled device (CCD).

7. The method of claim 1, wherein an outer portion of the first surface of the substrate is disposed on a substrate support when the first plurality of beams arrive at the first surface.

8. A method of treating a substrate comprising:
transmitting a first plurality of beams from a diffractive beam splitter to a first surface of a substrate to generate a reflection of a second plurality of beams, wherein the first plurality of beams are spaced apart from each other upon arriving at the first surface of the substrate;
receiving the second plurality of beams on a recording surface of an optical device, wherein the second plurality of beams are spaced apart from each other upon arriving at the recording surface;
determining a position on the recording surface for each beam of the second plurality of beams;
for each position of each beam of the second plurality of beams on the recording surface, comparing that individual position to an individual position on the recording surface of a corresponding beam from a third plurality of beams stored in a memory, wherein the third plurality of beams are generated by a reflection of a fourth plurality of beams incident upon a surface of an object other than the substrate;
determining a difference between the compared individual positions;
storing a result of the comparison in the memory; and
treating the substrate based on the comparison.

9. The method of claim 8, wherein treating the substrate comprises localized ion bombardment of a film deposited on the substrate.

10. The method of claim 8, wherein the position of each beam of the second plurality of beams on the recording surface and the position of each beam of the third plurality of beams on the recording surface each comprise a position of a centroid of the corresponding beam on the recording surface.

11. The method of claim 10, wherein
comparing the individual position of each beam of the second plurality of beams to the the individual position of the corresponding beam of the third plurality of beams comprises determining a vector from the centroid of each beam of the third plurality of beams on the recording surface to the centroid of each corresponding beam of the second plurality of beams on the recording surface.

12. The method of claim 8, wherein
a film is deposited on a second surface of the substrate and the first surface opposes the second surface, and
treating the substrate comprises treating substrate without moving the substrate from a substrate support on which the substrate was supported when the first plurality of beams were transmitted to the first surface of the substrate.

13. The method of claim 8, wherein treating the substrate comprises localized heating of a film deposited on the substrate.

14. The method of claim 11, further comprising calculating a local slope of the first surface for each location on the first surface on which the first plurality of beams are received based on the determined vectors.

* * * * *